(12) United States Patent
Lee et al.

(10) Patent No.: US 9,755,028 B2
(45) Date of Patent: Sep. 5, 2017

(54) SEMICONDUCTOR DEVICE AND METHOD FOR MANUFACTURING THE SAME

(71) Applicant: SUPER GROUP SEMICONDUCTOR CO., LTD., New Taipei (TW)

(72) Inventors: Yuan-Ming Lee, Taichung (TW); Chun-Ying Yeh, Hisnchu (TW)

(73) Assignee: SUPER GROUP SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 14/801,817

(22) Filed: Jul. 16, 2015

(65) Prior Publication Data

US 2016/0163805 A1    Jun. 9, 2016

(30) Foreign Application Priority Data

Dec. 5, 2014   (TW) .............................. 103142439 A

(51) Int. Cl.
| | |
|---|---|
| H01L 29/423 | (2006.01) |
| H01L 29/40 | (2006.01) |
| H01L 21/02 | (2006.01) |
| H01L 29/06 | (2006.01) |
| H01L 29/66 | (2006.01) |
| H01L 29/78 | (2006.01) |
| H01L 29/165 | (2006.01) |

(52) U.S. Cl.
CPC ........ *H01L 29/407* (2013.01); *H01L 21/0217* (2013.01); *H01L 29/063* (2013.01); *H01L 29/0607* (2013.01); *H01L 29/0611* (2013.01); *H01L 29/165* (2013.01); *H01L 29/4236* (2013.01); *H01L 29/66666* (2013.01); *H01L 29/66734* (2013.01); *H01L 29/7813* (2013.01); *H01L 29/7827* (2013.01); *H01L 29/66727* (2013.01)

(58) Field of Classification Search
CPC . H01L 29/407; H01L 29/063; H01L 29/4236; H01L 29/66666; H01L 29/7827; H01L 29/0607; H01L 29/0611
See application file for complete search history.

(56) References Cited

U.S. PATENT DOCUMENTS

2003/0224541 A1* 12/2003 Huang ................ H01J 37/3045
                                                                      438/14
2007/0007537 A1*  1/2007 Ogura ................ H01L 29/7828
                                                                      257/77

(Continued)

FOREIGN PATENT DOCUMENTS

TW    201207950 A    2/2012
TW    201403829 A    1/2014

*Primary Examiner* — Fei Fei Yeung Lopez
(74) *Attorney, Agent, or Firm* — CKC & Partners Co., Ltd.

(57) ABSTRACT

A method for manufacturing a semiconductor device is provided. The method includes operations below. First, an epitaxial layer is formed on a substrate. Then, a trench is formed in the epitaxial layer. Then, a first dielectric layer and a shield layer are formed in the trench, in which the shield layer is embedded within the first dielectric layer. Then, a spacer layer is formed in the trench and on the first dielectric layer. Finally, a second dielectric layer and a gate are formed in the trench and on the spacer layer, and a source is formed in the epitaxial layer surrounding the trench, in which the gate is embedded within the second dielectric layer, and the source surrounds the gate.

11 Claims, 19 Drawing Sheets

(56) References Cited

U.S. PATENT DOCUMENTS

| | | | |
|---|---|---|---|
| 2007/0215920 A1* | 9/2007 | Zundel | H01L 21/743 257/288 |
| 2008/0203433 A1* | 8/2008 | Sato | H01L 29/32 257/192 |
| 2009/0008709 A1 | 1/2009 | Yedinak et al. | |
| 2010/0006928 A1* | 1/2010 | Pan | H01L 29/407 257/330 |
| 2010/0117144 A1* | 5/2010 | Hirler | H01L 29/407 257/330 |
| 2012/0187474 A1 | 7/2012 | Rexer et al. | |

* cited by examiner

SEMICONDUCTOR DEVICE AND METHOD FOR MANUFACTURING THE SAME

RELATED APPLICATIONS

This application claims priority to Taiwanese Application Serial Number 103142439, filed Dec. 5, 2014, which are herein incorporated by reference.

BACKGROUND

Technical Field

The present disclosure relates to a semiconductor device and a method for manufacturing the same.

Description of Related Art

Power semiconductors are main components in many power electronic systems. In current applications of power semiconductors, high energy efficiency, high voltage-endurance, and low on-resistance are important factors, and researchers improve the performance of the power electronic systems by improving characteristics of power components and reducing package parasitic capacitance.

In the constant attempt to enhance characteristics of the power semiconductor, there is always a need in the related field to provide a novel power semiconductor.

SUMMARY

This disclosure provides a semiconductor device and a method for manufacturing the same, such that the semiconductor device has a larger breakdown voltage and a smaller on-resistance utilizing a properly designed structure.

In one aspect of the disclosure, a method for manufacturing a semiconductor device is provided. The method includes operations below. First, an epitaxial layer is formed on a substrate. Then, a trench is formed in the epitaxial layer. Then, a first dielectric layer and a shield layer are formed in the trench, in which the shield layer is embedded within the first dielectric layer. Then, a spacer layer is formed in the trench and on the first dielectric layer. Finally, a second dielectric layer and a gate are formed in the trench and on the spacer layer, and a source is formed in the epitaxial layer surrounding the trench, in which the gate is embedded within the second dielectric layer, and the source surrounds the gate.

In another aspect of the disclosure, a semiconductor device is provided. The semiconductor device includes a substrate, an epitaxial layer, a first dielectric layer, a shield layer, a second dielectric layer, a gate, a spacer layer, and a source. The epitaxial layer is disposed on the substrate. The first dielectric layer is disposed in the epitaxial layer. The shield layer is disposed in the first dielectric layer. The second dielectric layer is disposed in the epitaxial layer. The gate is disposed in the second dielectric layer. The spacer layer is disposed between the first dielectric layer and the second dielectric layer. The source is disposed in the epitaxial layer surrounding the second dielectric layer.

In another aspect of the disclosure, a semiconductor device is provided. The semiconductor device includes a substrate, a first dielectric layer, a shield layer, a spacer layer, an epitaxial layer, a second dielectric layer, a gate, and a source. The first dielectric layer is disposed in the substrate. The shield layer is disposed in the first dielectric layer. The spacer layer is disposed on the first dielectric layer and the substrate. The epitaxial layer is disposed on the spacer layer. The second dielectric layer is disposed in the epitaxial layer. The gate is disposed in the second dielectric layer. The source is disposed in the epitaxial layer surrounding to the second dielectric layer.

By disposing the shield layer between the substrate and the gate, the shield layer generates pinch-off effect when the semiconductor device is operated in reverse bias, such that the charge balance and the reduced surface field (RESURF) is generated and a smoother electric field distribution is generated between the substrate and the gate. Therefore, the distance between the substrate and the gate needs to not be large enough to make the semiconductor device have a larger breakdown voltage, and thus the on-resistance of the semiconductor device will be reduced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

FIGS. 1A to 1J are cross-sectional views of intermediate steps of a method for manufacturing a semiconductor device 100 according to one embodiment of this disclosure. Specifically, the semiconductor device 100 is a power semiconductor device.

Figure 1A:
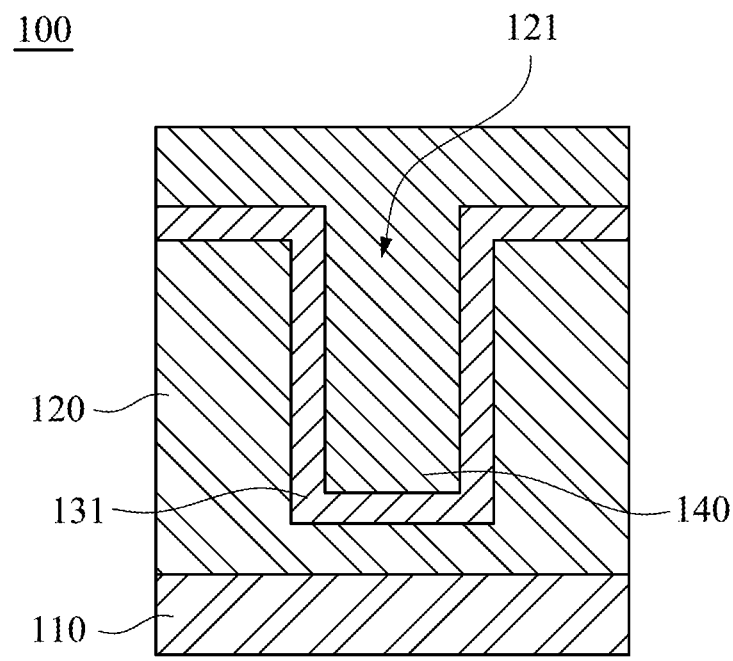
FIGS. 1A to 1J are cross-sectional views of intermediate steps of a method for manufacturing a semiconductor device according to one embodiment of this disclosure.

As shown in FIG. 1A, first, an epitaxial layer 120 is formed on the substrate 110, and then a trench 121 is formed in the epitaxial layer 120. Then, a dielectric layer 131 is formed on the epitaxial layer 120. Then, a shield layer 140 is formed on the dielectric layer 131. A part of the dielectric layer 131 and a part of the shield layer 140 is formed in the trench 121. The forming method of the trench 121 is, for example, etching. The substrate 110, the epitaxial layer 120, and the shield layer 140 are made of, for example, Poly-Silicon. The dielectric layer 131 is made of, for example, silicon dioxide ($SiO_2$) or silicon oxynitride (SiON).

Figure 1B:
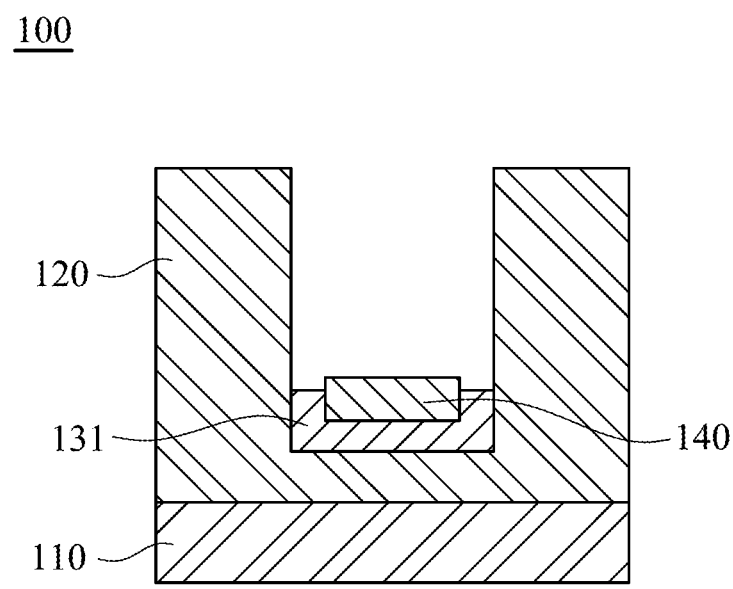

As shown in FIG. 1B, first, an upper part of the shield layer 140 is removed, and then an upper part of the dielectric layer 131 is removed. Therefore, a lower part of the shield layer 140 is embedded within the dielectric layer 131.

The removal method of the shield layer 140 and the dielectric layer 131 is, for example, etching. When the upper part of the dielectric layer 131 is removed, the shield layer 140 functions as a mask.

Figure 1C:
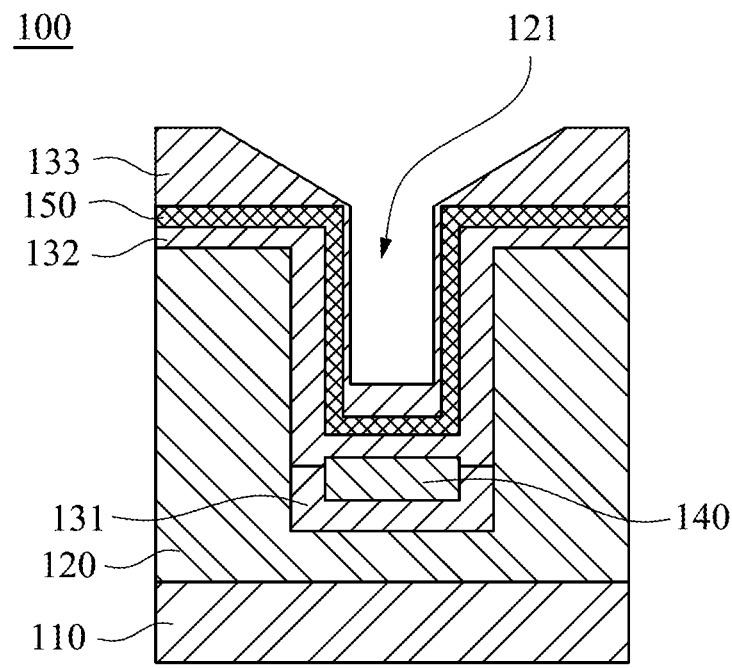

As shown in FIG. 1C, first, a dielectric layer 132 is formed on the epitaxial layer 120, the dielectric layer 131, and the shield layer 140. Then, a barrier layer 150 is formed on the dielectric layer 132, and then a dielectric layer 133 is formed on the barrier layer 150. A part of the dielectric layer 132, a part of the dielectric layer 133, and a part of the barrier layer 150 is formed in the trench 121. Therefore, the shield layer 140 is embedded within the dielectric layer 131 and the dielectric layer 132.

The forming method of the dielectric layer 133 is high-density plasma chemical vapor deposition. Therefore, the thickness of a sidewall part of the dielectric layer 133 is less than the thickness of other parts of the dielectric layer 133. The barrier layer 150 is made of, for example, silicon nitride (SiN). The dielectric layer 132 and 133 are made of, for example, silicon dioxide ($SiO_2$) or silicon oxynitride (SiON).

Figure 1D:
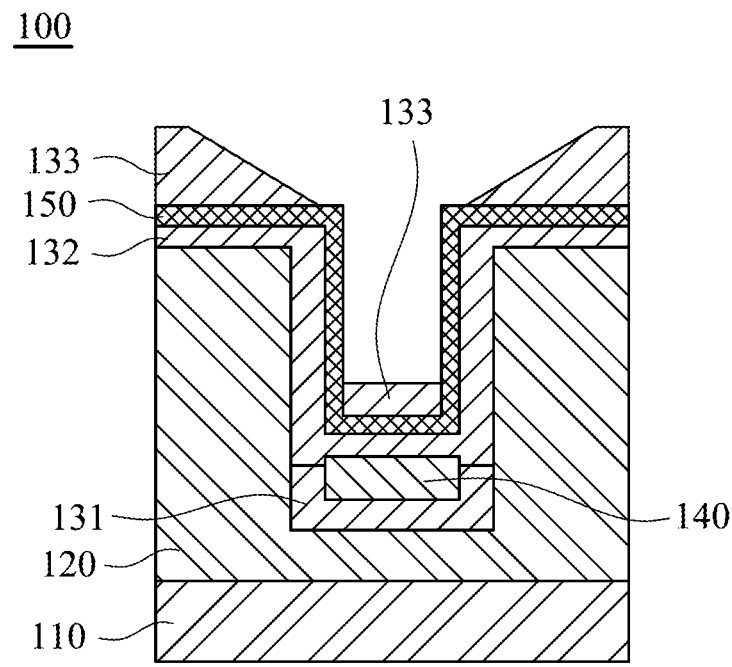

As shown in FIGS. 1C and 1D, the sidewall part of the dielectric layer 133 is removed. The removal method of the dielectric layer 133 is, for example, etching.

Figure 1E:
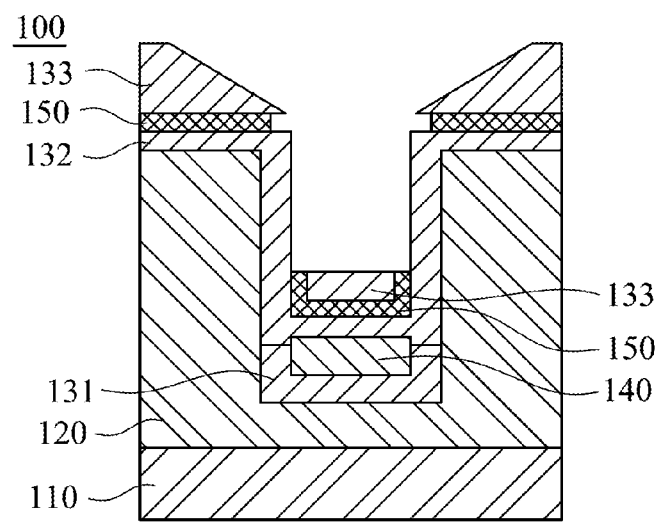

As shown in FIGS. 1D and 1E, a sidewall part of the barrier layer 150 is removed, i.e., the part of the barrier layer 150 which is not covered by the dielectric layer 133 is removed. The removal method of the barrier layer 150 is, for example, etching.

Figure 1F:
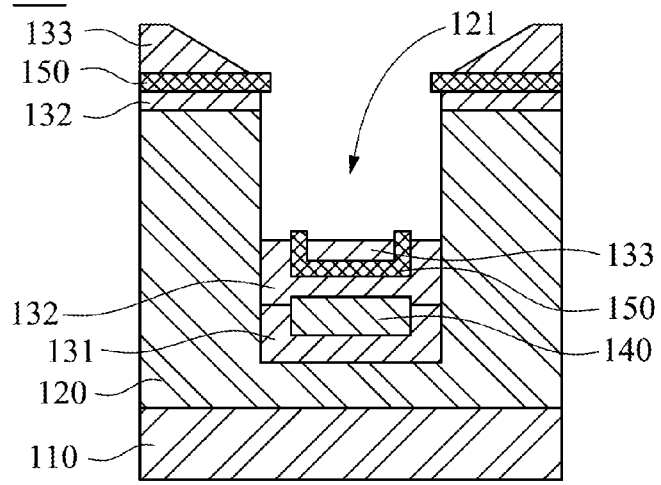

As shown in FIGS. 1E and 1F, a sidewall part of the dielectric layer 132 is removed, i.e., the part of the dielectric layer 132 which is not covered by the dielectric layer 133 and barrier layer 150 is removed. In addition, an upper part of the dielectric layer 133 disposed outside the trench 121 is partially removed during the process (the entire dielectric layer 133 is removed in FIG. 1H). The removal method of the dielectric layer 132 and 133 is, for example, etching.

Figure 1G:
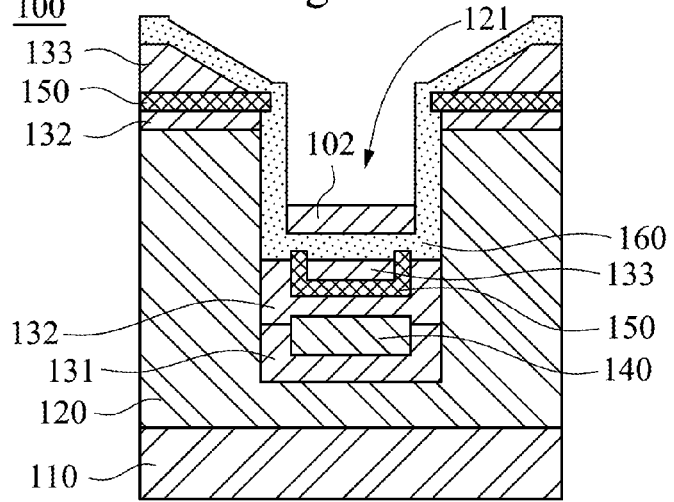

As shown in FIGS. 1F and 1G, a spacer layer 160 is formed on the dielectric layer 132 and 133, and then a hard mask layer 102 is formed on the spacer layer 160. Specifically, the hard mask layer 102 and a part of the spacer layer 160 are formed in the trench 121.

In the embodiment, the spacer layer 160 is made of PolySilicon, and the dopant ion concentration of the spacer layer 160 is greater than the dopant ion concentration of the epitaxial layer 120. The spacer layer 160 may also be made of silicon (Si). The hard mask layer 102 is made of, for example, silicon dioxide ($SiO_2$) or silicon oxynitride (SiON).

Figure 1H:
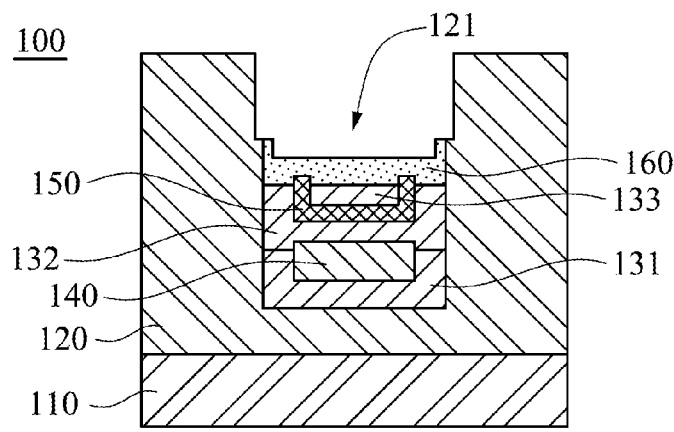

As shown in FIGS. 1G and 1H, first, an upper part of the spacer layer 160 is removed, such that the height of the residual spacer layer 160 is less than the height of the hard mask layer 102. The removal method of the upper part of the spacer layer 160 is, for example, etching. Then, the hard mask layer 102 and the dielectric layer 133 disposed outside the trench 121 are removed. Then, the barrier layer 150 disposed outside the trench 121 is removed. Finally, the dielectric layer 132 disposed outside the trench 121 is removed.

Figure 1I:
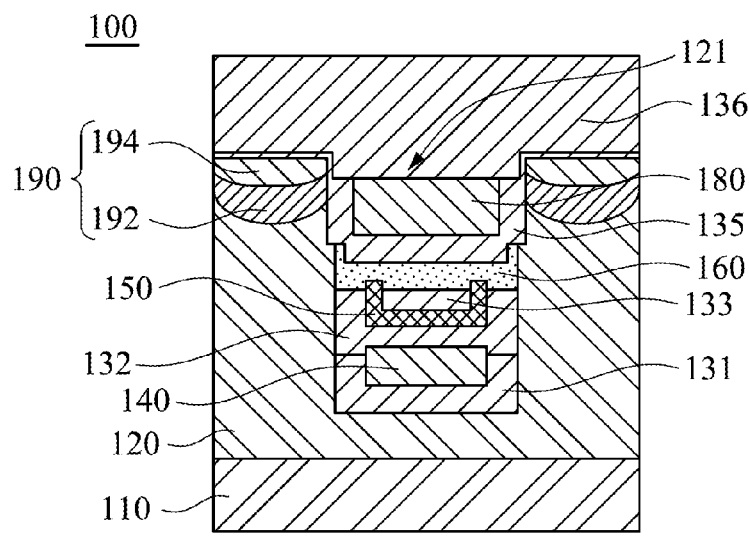

Then, as shown in FIGS. 1H and 1I, first, a sacrificial oxide layer (not shown in Figs.) is formed in surface parts of the epitaxial layer 120 and the spacer layer 160, and then the sacrificial oxide layer is removed, such that a diameter of an upper part of the trench 121 is enlarged. Specifically, the forming method of the sacrificial oxide layer is to heat and oxidize the epitaxial layer 120. The sacrificial oxide layer is made of, for example, silicon dioxide ($SiO_2$). The removal method of the sacrificial oxide layer is, for example, etching.

As shown in FIG. 1I, a dielectric layer 135 is formed in surface parts of the epitaxial layer 120 and the spacer layer 160. A part of the dielectric layer 135 is formed in the trench 121 and on the spacer layer 160. The forming method of the dielectric layer 135 is to heat and oxidize the epitaxial layer 120. The dielectric layer 135 is made of, for example, silicon dioxide ($SiO_2$).

Then, the gate 180 is formed on the dielectric layer 135, and then an upper part of the gate 180 is removed, such that the residual gate 180 is disposed in the trench 121.

Then, a source 190 is formed in the epitaxial layer 120 surrounding the trench 121. Therefore, the source 190 surrounds the gate 180. The source 190 includes a p-type region 192 and an n-type region 194. The forming methods of the source 190 are ion implantation and drive in.

Then, a dielectric layer 136 is formed on the dielectric layer 135 and the gate 180, such that the gate 180 is embedded within the dielectric layers 135 and 136.

Figure 1J:
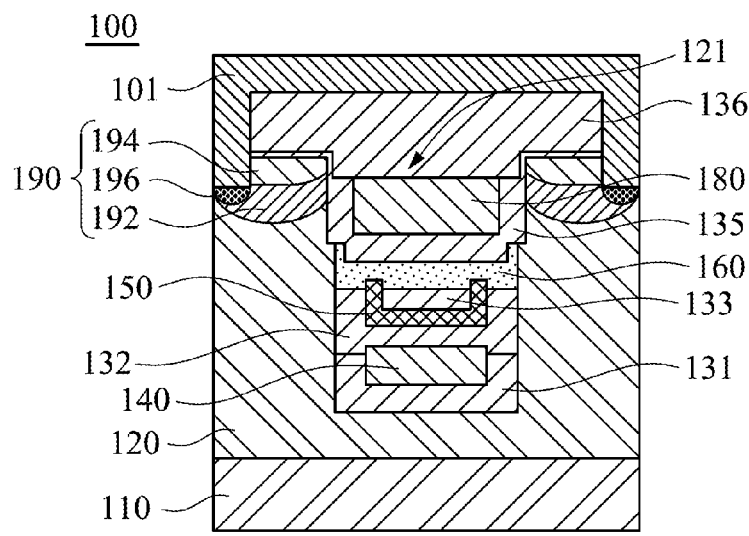

As shown in FIG. 1J, first, a part of the dielectric layer 136 is removed, such that the p-type region 192 and the n-type region 194 of the source 190 are not covered by the dielectric layer 136. Then, a metal contact region 196 is formed in the p-type region 192. Specifically, the forming methods of the metal contact region 196 are ion implantation and drive in.

Finally, a metal layer 101 is formed on the metal contact region 196 and the dielectric layer 136.

In the semiconductor device 100, the substrate 110 functions as a drain. By disposing the shield layer 140 between the substrate 110 and the gate 180, the shield layer 140 generates a pinch-off effect when the semiconductor device 100 is operated in reverse bias, such that the charge balance and the reduced surface field (RESURF) is generated and a smoother electric field distribution is generated between the substrate 110 and the gate 180. Therefore, the distance between the substrate 110 and the gate 180 needs to not be large enough to make the semiconductor device 100 have a larger breakdown voltage, and thus the on-resistance of the semiconductor device 100 will be reduced.

In addition, by disposing the spacer layer 160 between the shield layer 140 and the gate 180, the on-resistance of the semiconductor device 100 is further reduced. The pinch-off effect between shield layer 140 and the gate 180 also effectively enhances the voltage-endurance of the spacer layer 160.

The method is compatible with the relevant processes for manufacturing the traditional power semiconductor device, so the semiconductor device 100 can be manufactured by slightly adjusting the original processes. In addition, the shield layer 140 may be grounded or floating. The shield layer 140 makes the semiconductor device 100 has better capacitance characteristics.

FIGS. 2A to 2F are cross-sectional views of intermediate steps of the method for manufacturing the semiconductor device 100 according to another embodiment of this disclosure. The embodiment is similar to the aforementioned embodiment, and differences are described below.

Figure 2A:
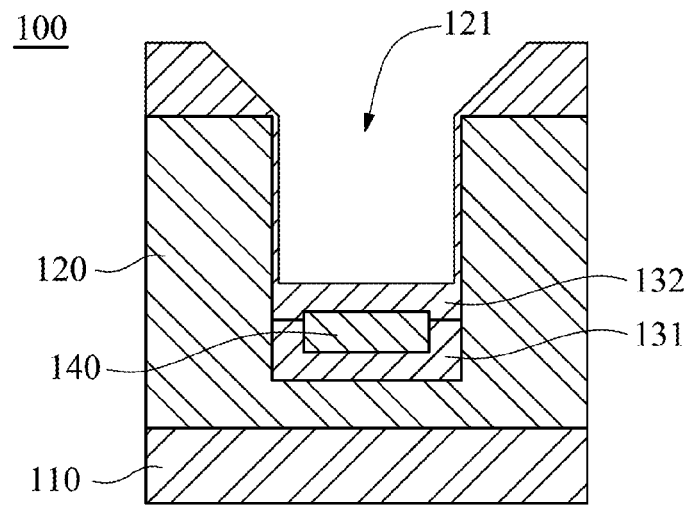
FIGS. 2A to 2F are cross-sectional views of intermediate steps of the method for manufacturing the semiconductor device according to another embodiment of this disclosure.

As shown in FIG. 2A, first, the epitaxial layer 120, the trench 121, the dielectric layer 131, and the shield layer 140 are respectively formed on the substrate 110 by the processes shown in FIGS. 1A and 1B. Then, the dielectric layer 132 is formed on the epitaxial layer 120, the dielectric layer 131, and the shield layer 140. A part of the dielectric layer 132 is formed in the trench 121. The forming method of the dielectric layer 132 is high-density plasma chemical vapor deposition.

Figure 2B:
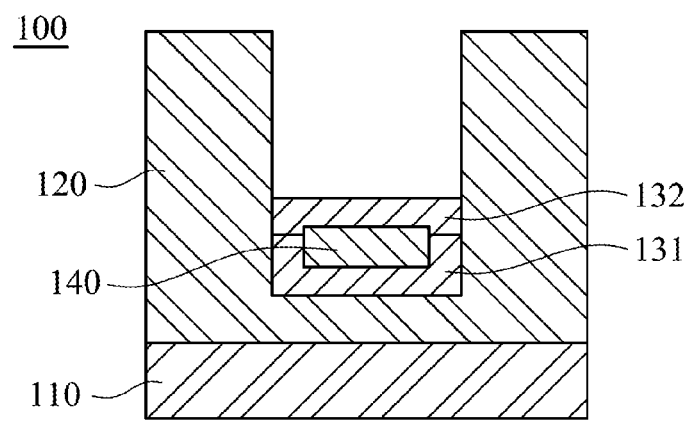

As shown in FIG. 2B, an upper part of the dielectric layer 132 is removed, and only a bottom part of the dielectric layer 132 is remained. Specifically, the removal method of the dielectric layer 132 is first performing an etching process and then performing chemical-mechanical planarization.

Figure 2C:
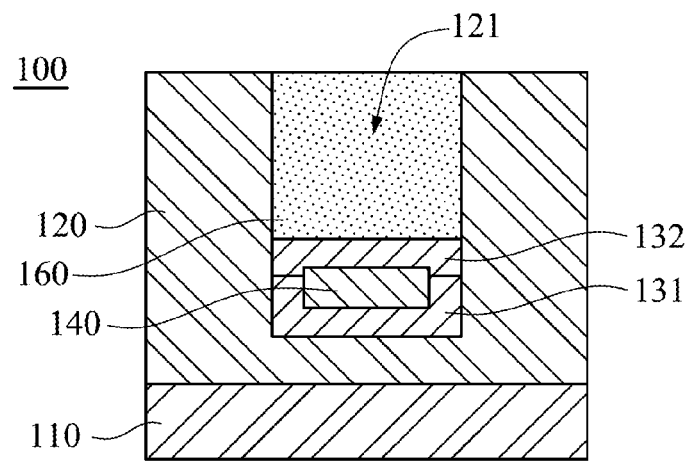

As shown in FIG. 2C, the spacer layer 160 is formed on the dielectric layer 132 and in the trench 121. Specifically, the forming method of the spacer layer 160 is first performing a deposition process and then performing chemical-mechanical planarization.

Figure 2D:
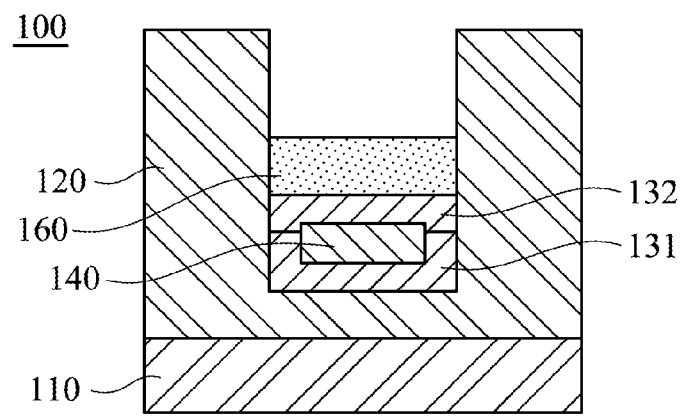

As shown in FIG. 2D, an upper part of the spacer layer 160 is removed to control the thickness of the spacer layer 160. Specifically, the removal method of the spacer layer 160 is etching. In order to avoid damaging the epitaxial layer 120 during the etching process, a patterned hard mask layer (not shown in Figs.) may be disposed on the epitaxial layer 120 before the etching process is performed, and then the patterned hard mask layer is removed.

Figure 2E:
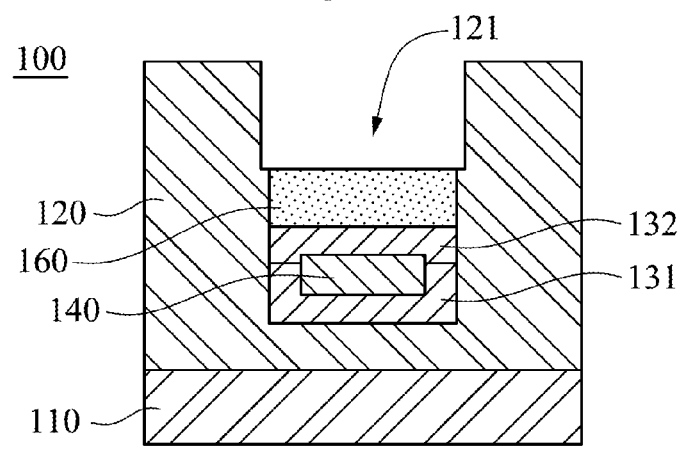

As shown in FIG. 2E, the sacrificial oxide layer (not shown in Figs.) is formed in surface parts of the epitaxial layer 120 and the spacer layer 160, and then the sacrificial oxide layer is removed, such that a diameter of an upper part of the trench 121 is enlarged.

Figure 2F:
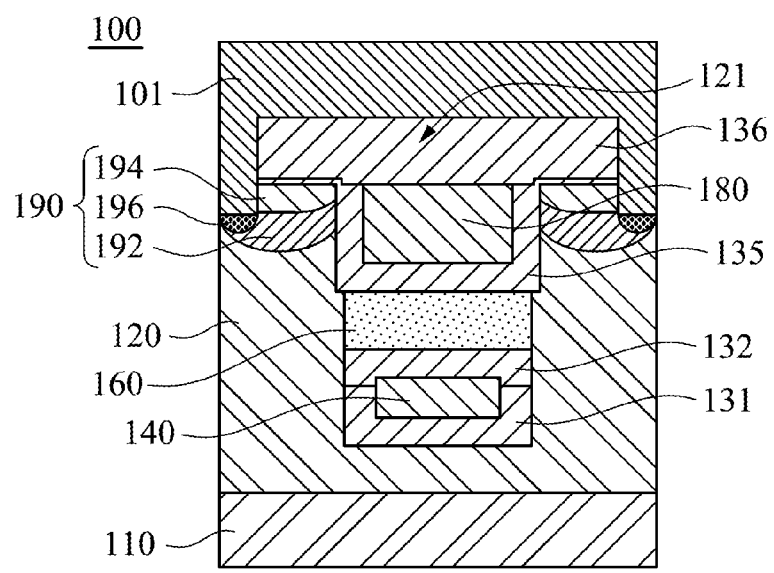

As shown in FIG. 2F, the dielectric layers 135 and 136, the gate 180, the source 190, and the metal layer 101 are respectively formed.

Since no barrier layer 150 is formed in the embodiment, the process operations in the embodiment are less than the process operations in the aforementioned embodiment.

Figure 3A:
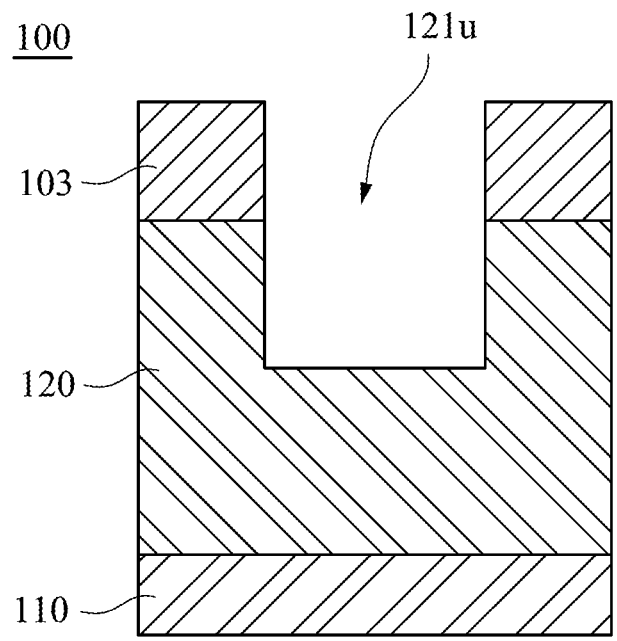
FIGS. 3A to 3O are cross-sectional views of intermediate steps of the method for manufacturing the semiconductor device according to another embodiment of this disclosure.
Figure 3B:
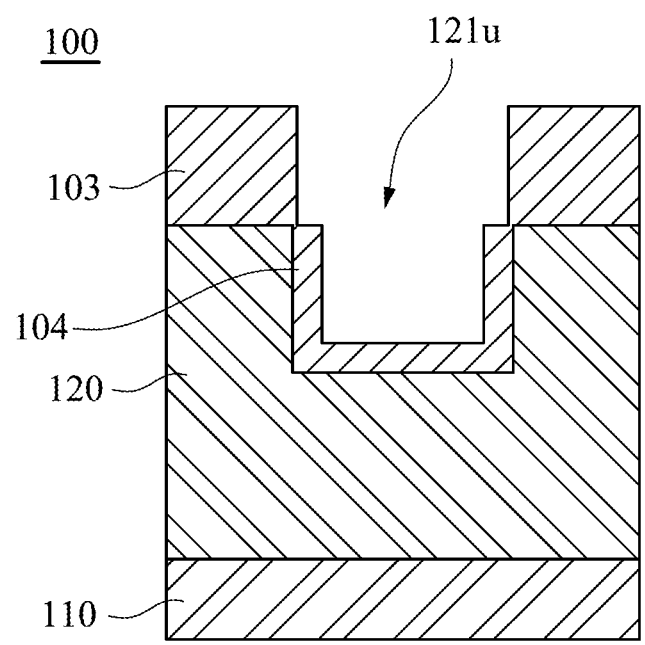
Figure 3C:
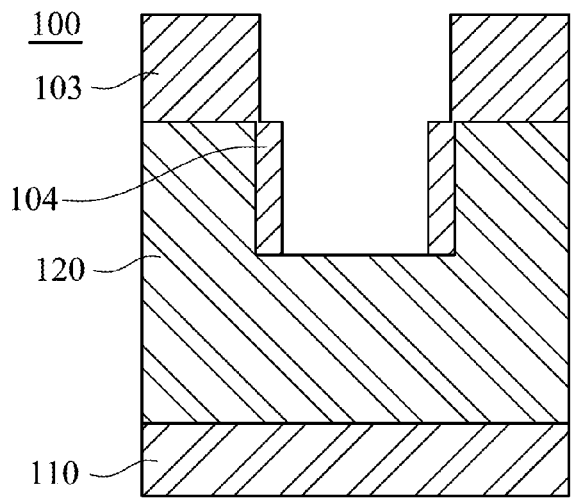
Figure 3D:
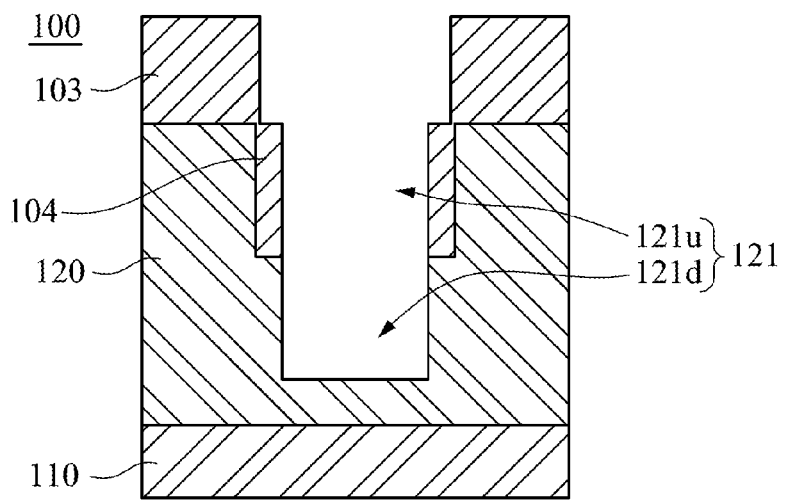
Figure 3E:
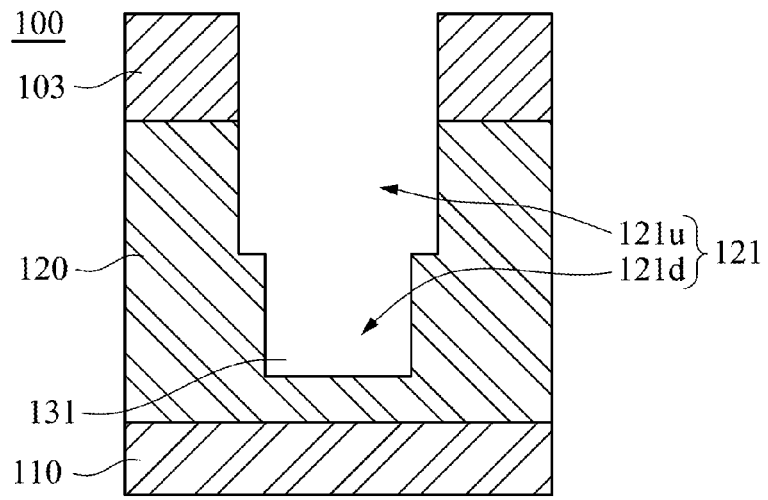
Figure 3F:
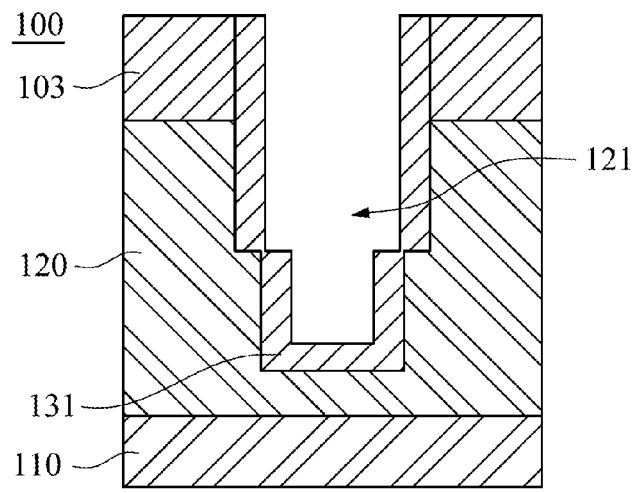
Figure 3G:
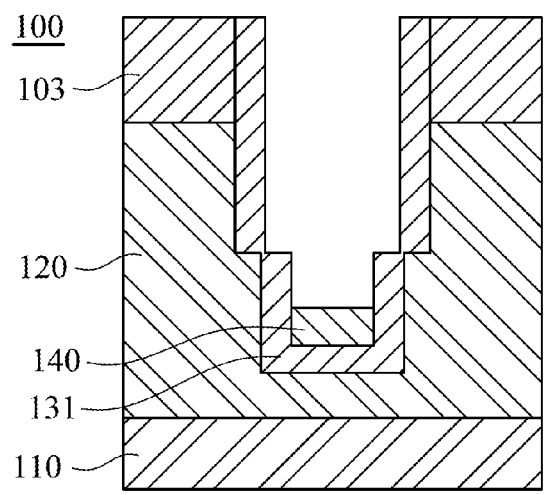
Figure 3H:
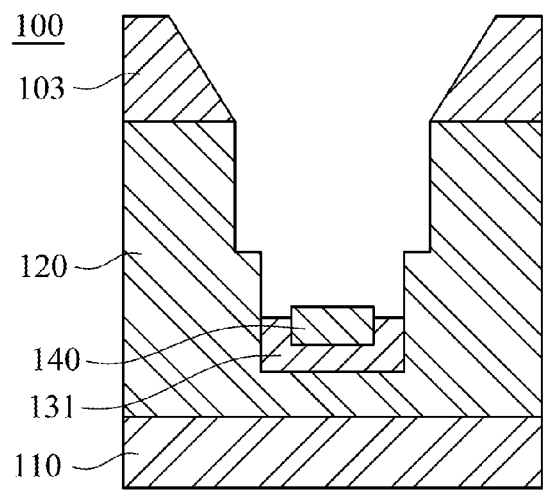
Figure 3I:
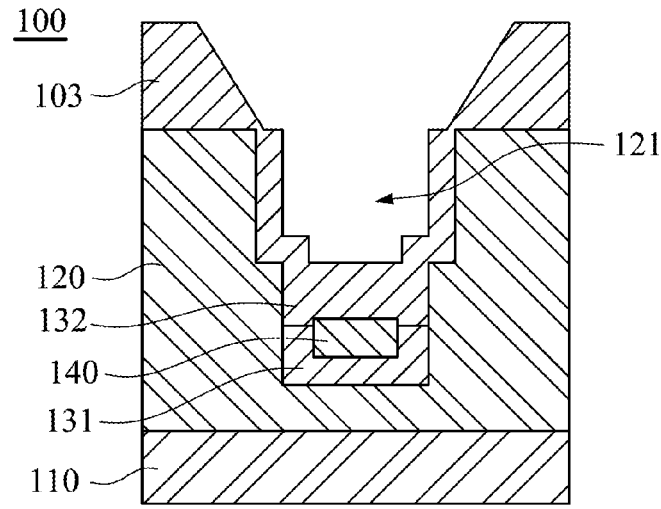
Figure 3J:
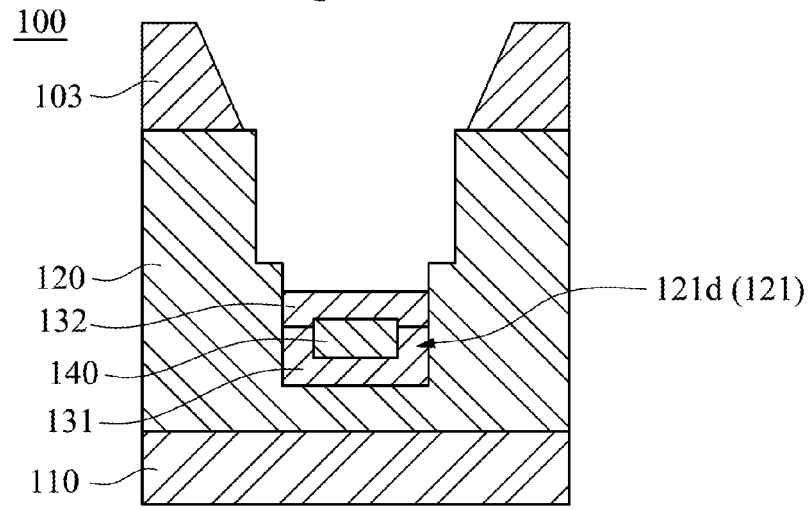
Figure 3K:
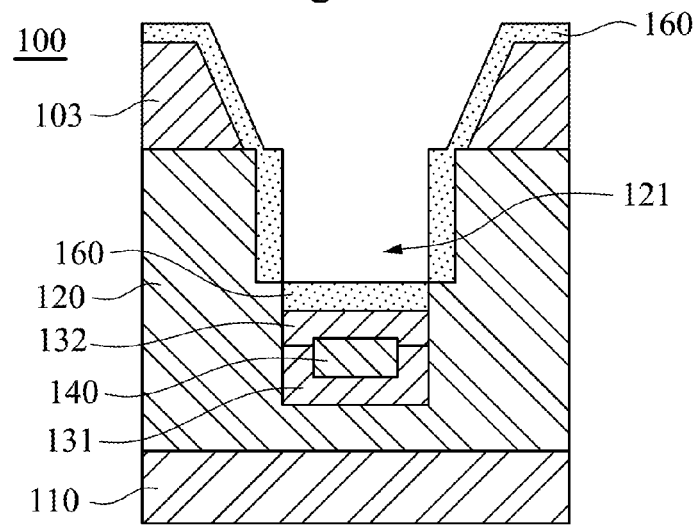
Figure 3L:
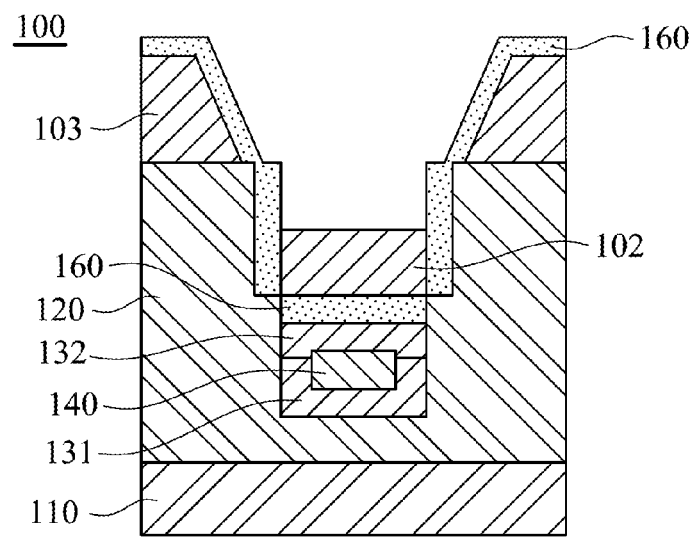
Figure 3M:
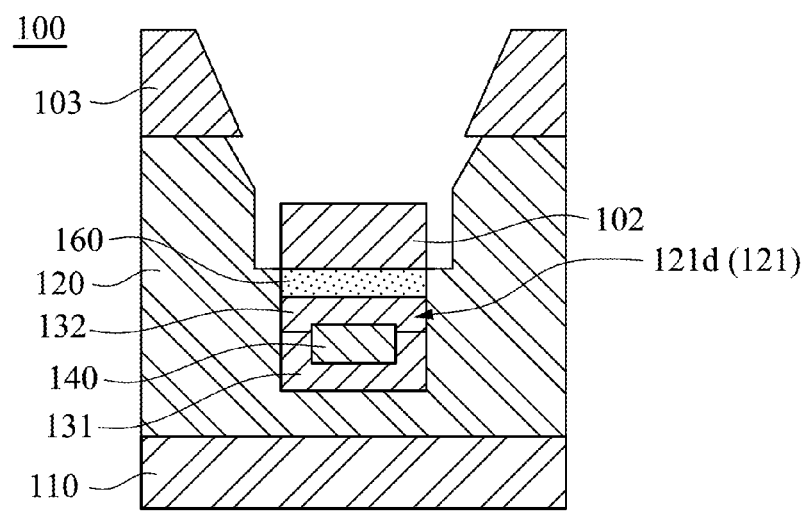
Figure 3N:
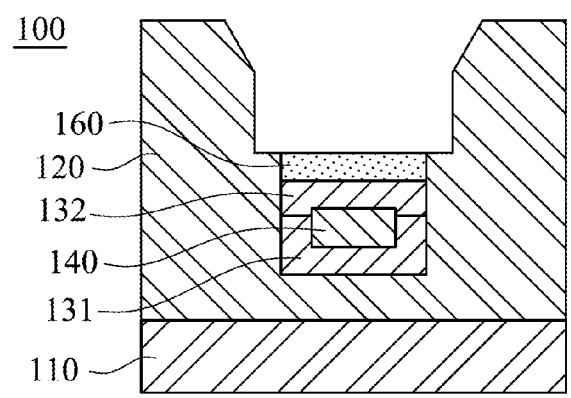
Figure 3O:
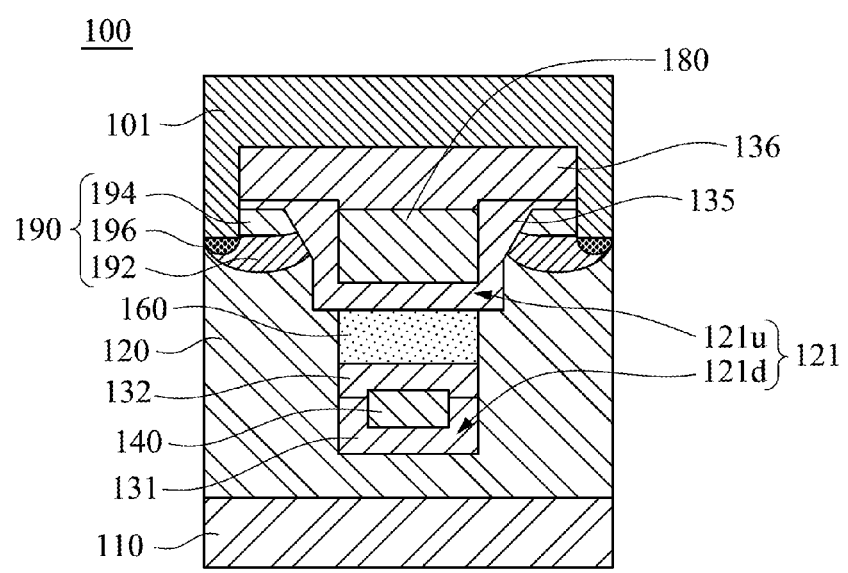

FIGS. 3A to 3O are cross-sectional views of intermediate steps of the method for manufacturing the semiconductor device 100 according to another embodiment of this disclosure. The embodiment is similar to the aforementioned embodiments, and differences are described below.

As shown in FIG. 3A, first, the epitaxial layer 120 is formed on the substrate 110, and then a hard mask layer 103 is formed on the epitaxial layer 120. Then, an upper part 121u of the trench is formed in the epitaxial layer 120 and the hard mask layer 103. The hard mask layer 103 is made of, for example, silicon dioxide ($SiO_2$).

As shown in FIG. 3B, a hard mask layer 104 is formed on the epitaxial layer 120 and in the upper part 121u of the trench. The hard mask layer 104 is made of, for example, silicon dioxide ($SiO_2$) or silicon oxynitride (SiON).

As shown in FIG. 3C, a bottom part of the hard mask layer 104 is removed. The removal method of the hard mask layer 104 is, for example, etching.

As shown in FIG. 3D, a lower part 121d of the trench 121 is formed in the epitaxial layer 120. The forming method of the lower part 121d of the trench 121 is, for example, etching.

As shown in FIGS. 3D and 3E, the hard mask layer 104 is removed. The removal method of the hard mask 104 is, for example, etching. Therefore, a diameter of the upper part 121u of the trench 121 is greater than the diameter of the lower part 121d of the trench 121.

As shown in FIG. 3F, the dielectric layer 131 is formed on the epitaxial layer 120. The dielectric layer 131 is formed in the trench 121. As shown in FIG. 3G, the shield layer 140 is formed on the dielectric layer 131. As shown in FIG. 3H, an upper part of the dielectric layer 131 and a part of the hard mask layer 103 are removed, such that the height of the residual dielectric layer 131 is less than the height of the shield layer 140. The removal method of the upper part of the dielectric layer 131 and the part of the hard mask layer 103 is etching.

As shown in FIG. 3I, the dielectric layer 132 is formed on the epitaxial layer 120, the dielectric layer 131, and the shield layer 140. In other words, the dielectric layer 132 is formed in the trench 121. As shown in FIG. 3J, an upper part of the dielectric layer 132 is removed. Specifically, the residual dielectric layer 132 is disposed in the lower part 121d of the trench 121.

As shown in FIG. 3K, the spacer layer 160 is formed on the hard mask layer 103, the epitaxial layer 120, and the dielectric layer 132. A part of the spacer layer 160 is formed in the trench 121. As shown in FIG. 3L, the hard mask layer 102 is formed on the spacer layer 160. The forming method of the hard mask layer 102 is first performing a deposition process and then performing an etching process.

As shown in FIG. 3M, an upper part of the spacer layer 160 is removed, such that the residual spacer layer 160 is disposed in the lower part 121d of the trench 121.

As shown in FIGS. 3M and 3N, the hard mask layers 102 and 103 are removed. As shown in FIG. 3O, the dielectric layer 135, the gate 180, the dielectric layer 136, the gate 190, and the metal layer 101 are respectively formed.

In the embodiment, the upper part 121u and the lower part 121d of the trench 121 are respectively formed by two etching processes. Therefore, the diameters of the upper part 121u and the lower part 121d of the trench 121 are effectively controlled, and the diameter of the upper part 121u of the trench 121 is greater than the diameter of the lower part 121d of the trench 121.

FIGS. 4A to 4H are cross-sectional views of intermediate steps of the method for manufacturing the semiconductor device 100 according to another embodiment of this disclosure. The embodiment is similar to the aforementioned embodiments, and differences are described below.

Figure 4A:
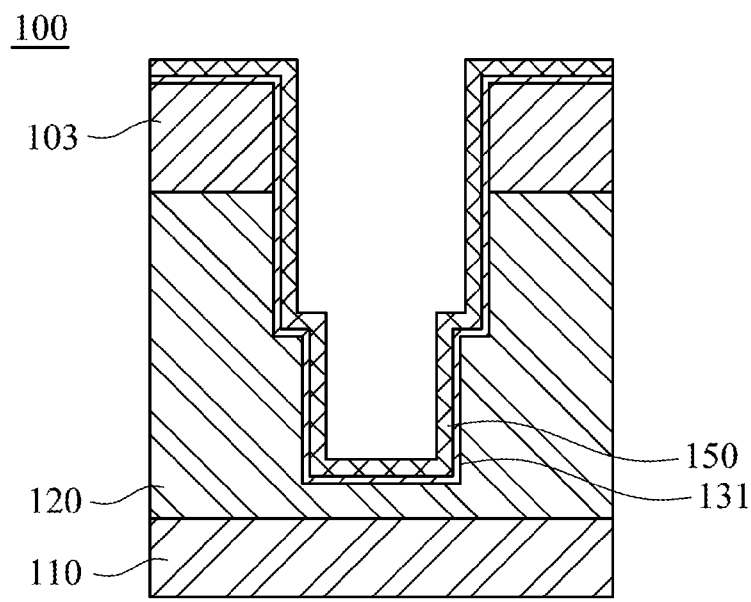
FIGS. 4A to 4H are cross-sectional views of intermediate steps of the method for manufacturing the semiconductor device according to another embodiment of this disclosure.

As shown in FIG. 4A, first, the processes shown in FIGS. 3A to 3E are performed, and then the dielectric layer 131 is formed on the epitaxial layer 120 and the hard mask layer 103. Then, the barrier layer 150 is formed on the dielectric layer 131.

Figure 4B:
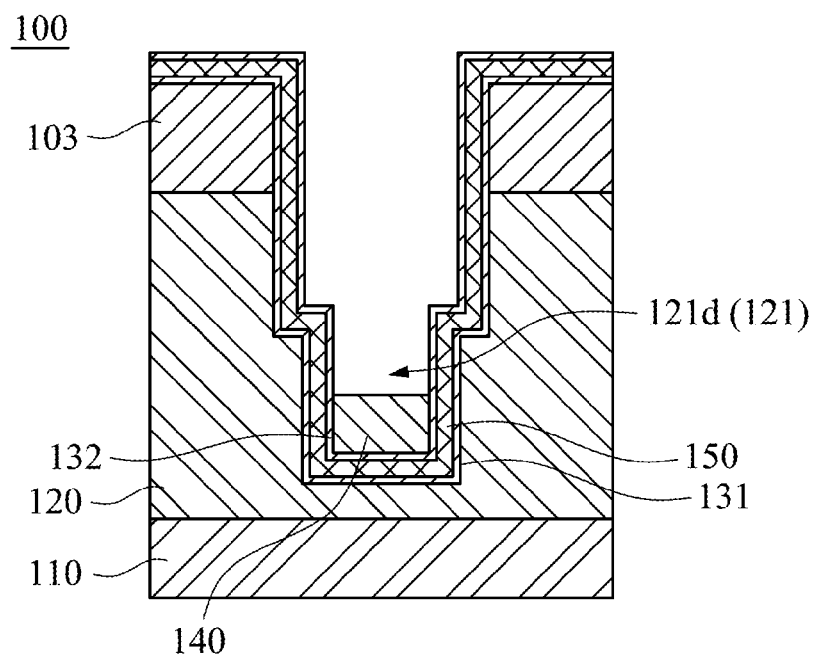

As shown in FIG. 4B, the dielectric layer 132 is formed on the barrier layer 150, and then the shield layer 140 is formed on the dielectric layer 132. Specifically, the forming method of the shield layer 140 is first performing a deposition process and then performing an etching process. The shield layer 140 is formed in the lower part 121d of the trench 121.

Figure 4C:
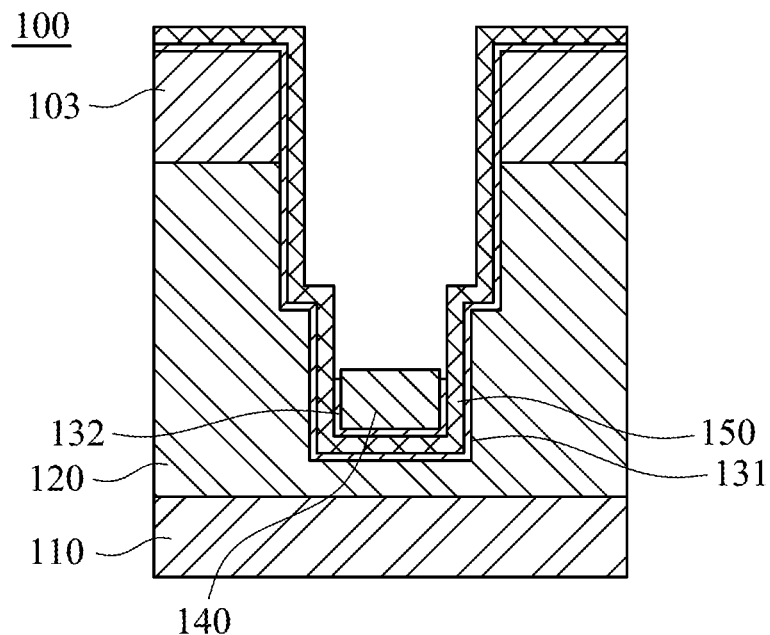

As shown in FIG. 4C, an upper part of the dielectric layer 132 is removed, such that the height of dielectric layer 132 is less than the height of the shield layer 140. Therefore, a lower part of the shield layer 140 is embedded within the dielectric layer 132.

Figure 4D:
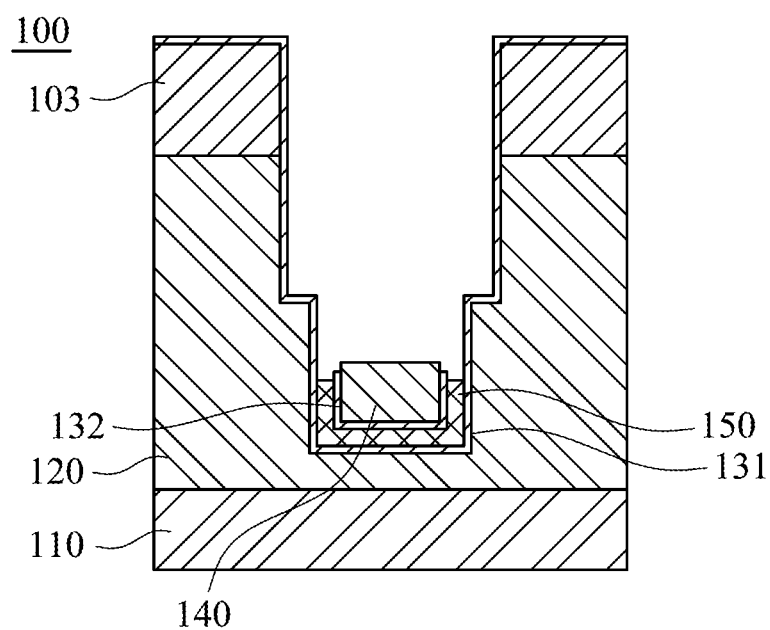

As shown in FIG. 4D, an upper part of the barrier layer 150 is removed. Specifically, the residual barrier layer 150 is disposed between the dielectric layers 131 and 132.

Figure 4E:
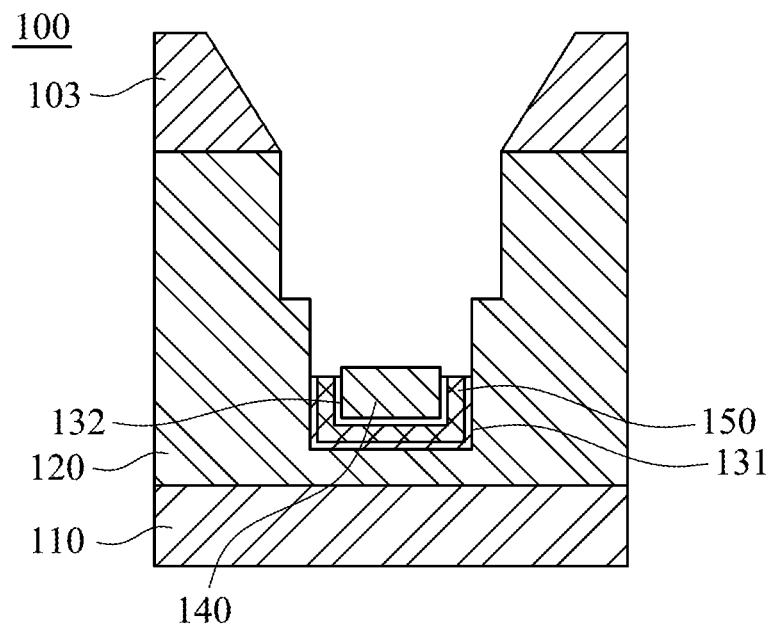

As shown in FIG. 4E, an upper part of the dielectric layer 131 is removed. Specifically, the residual dielectric layer 131 is disposed between the barrier layer 150 and the epitaxial layer 120.

Figure 4F:
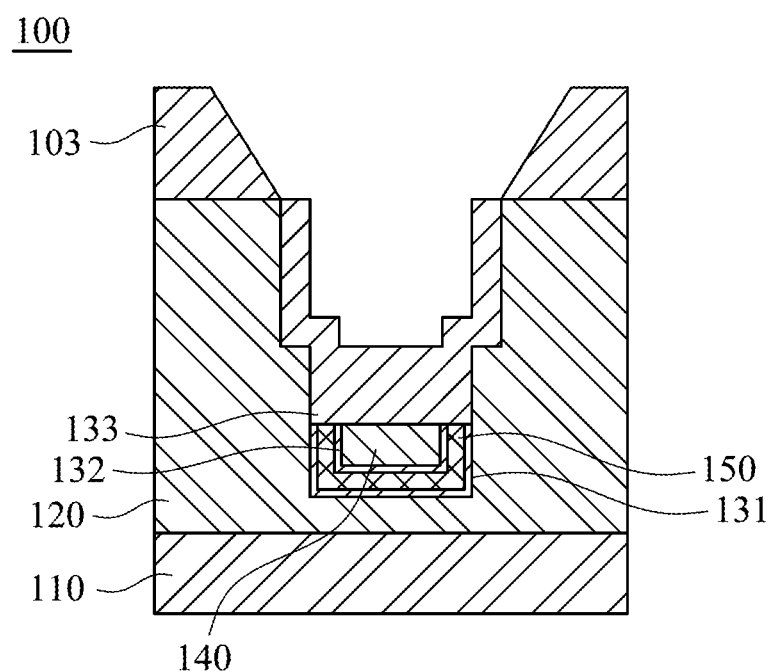

As shown in FIG. 4F, the dielectric layer 133 is formed on the epitaxial layer 120, the dielectric layers 131 and 132, the shield layer 140, and the barrier layer 150.

Figure 4G:
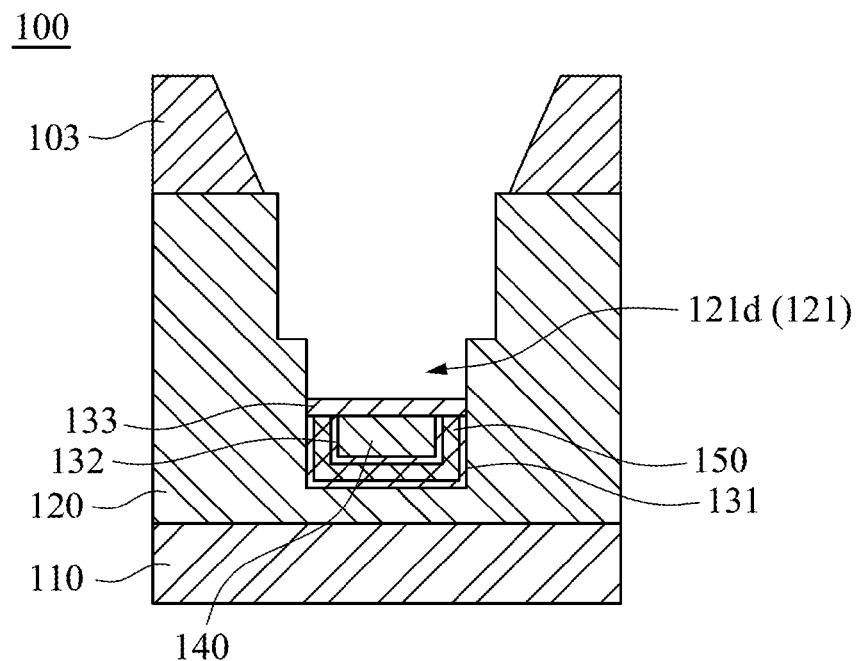

As shown in FIG. 4G, an upper part of the dielectric layer 133 is removed. The residual dielectric layer 133 is disposed in the lower part 121d of the trench 121. Therefore, the shield layer 140 is embedded within the dielectric layers 131, 132, and 133.

Figure 4H:
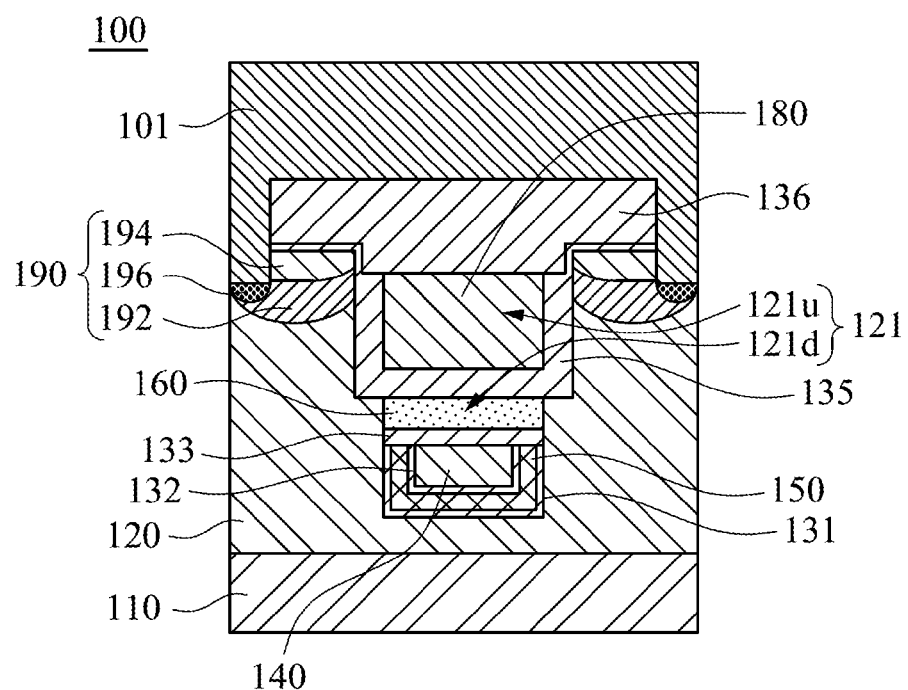

As shown in FIG. 4H, the hard mask layer 103 is removed, and then the spacer layer 160, the dielectric layer 135, the gate 180, the dielectric layer 136, the source 190, and the metal layer 101 are respectively formed.

Compared with the processes shown in FIGS. 3A to 3O, the barrier layer 150 is formed between the dielectric layers 131 and 132 in the embodiment.

FIGS. 5A to 5G are cross-sectional views of intermediate steps of the method for manufacturing the semiconductor device 100 according to another embodiment of this disclosure. The embodiment is similar to the aforementioned embodiments, and differences are described below.

Figure 5A:
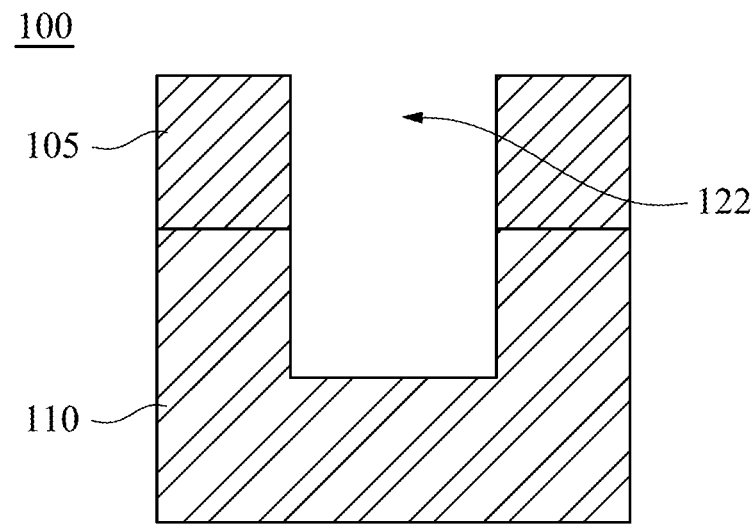
FIGS. 5A to 5G are cross-sectional views of intermediate steps of the method for manufacturing the semiconductor device according to another embodiment of this disclosure.

As shown in FIG. 5A, a hard mask layer 105 is formed on the substrate 110, and then a trench 122 is formed in the hard mask layer 105 and the substrate 110. The hard mask layer 105 is made of, for example, silicon dioxide (SiO$_2$).

Figure 5B:
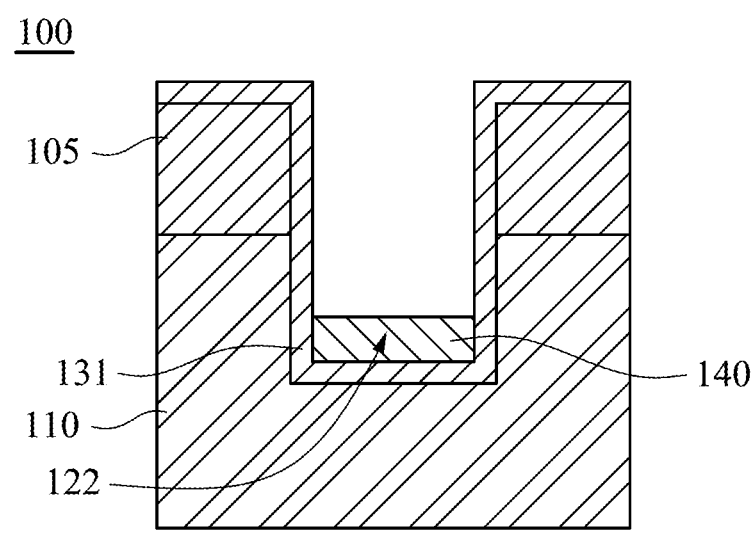

As shown in FIG. 5B, the dielectric layer 131 is formed on the hard mask layer 105 and the substrate 110, and then the shield layer 140 is formed on the dielectric layer 131.

Figure 5C:
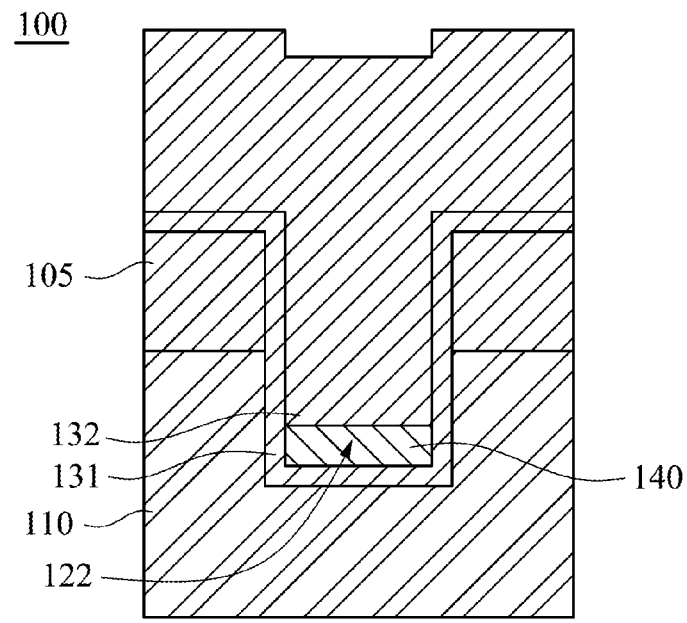

As shown in FIG. 5C, the dielectric layer 132 is formed on the dielectric layer 131 and the shield layer 140.

Figure 5D:
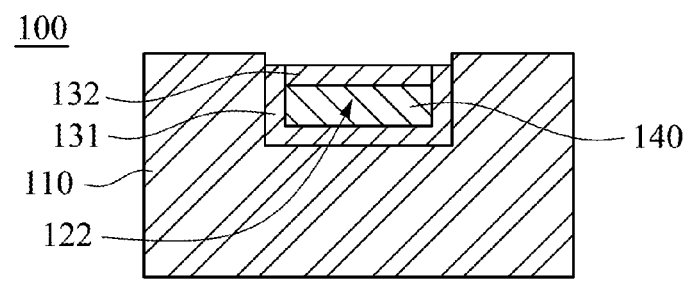

As shown in FIG. 5D, the hard mask layer 105 and upper parts of the dielectric layers 131 and 132 are removed, such that the residual dielectric layers 131 and 132 are disposed in the trench 122. Specifically, the removal method of the upper parts of the dielectric layers 131 and 132 and the hard mask layer 105 is first performing chemical-mechanical planarization and then performing an etching process to etch the upper parts of the dielectric layers 131 and 132.

Figure 5E:
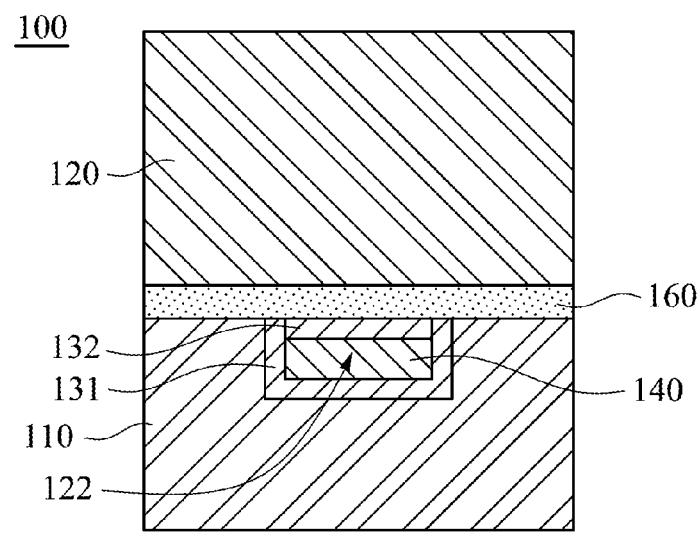

As shown in FIG. 5E, the spacer layer 160 and the epitaxial layer 120 are sequentially formed on or above the substrate 110 and the dielectric layers 131 and 132.

Figure 5F:
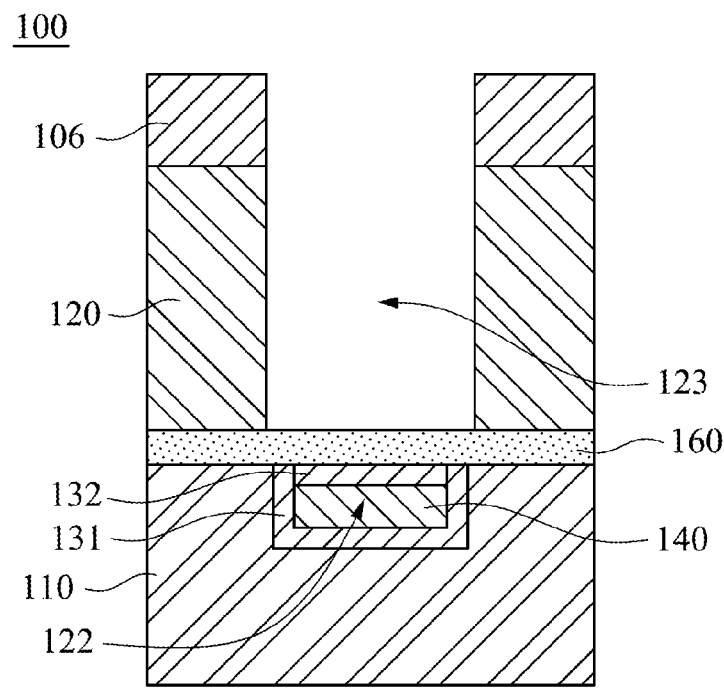

As shown in FIG. 5F, a hard mask layer 106 is formed on the epitaxial layer 120, and then a trench 123 is formed in the hard mask layer 106 and the epitaxial layer 120. The trench 123 is corresponding to (aligned with) the trench 122. The trench 123 is usually at least greater than or equals to the trench 122.

Figure 5G:
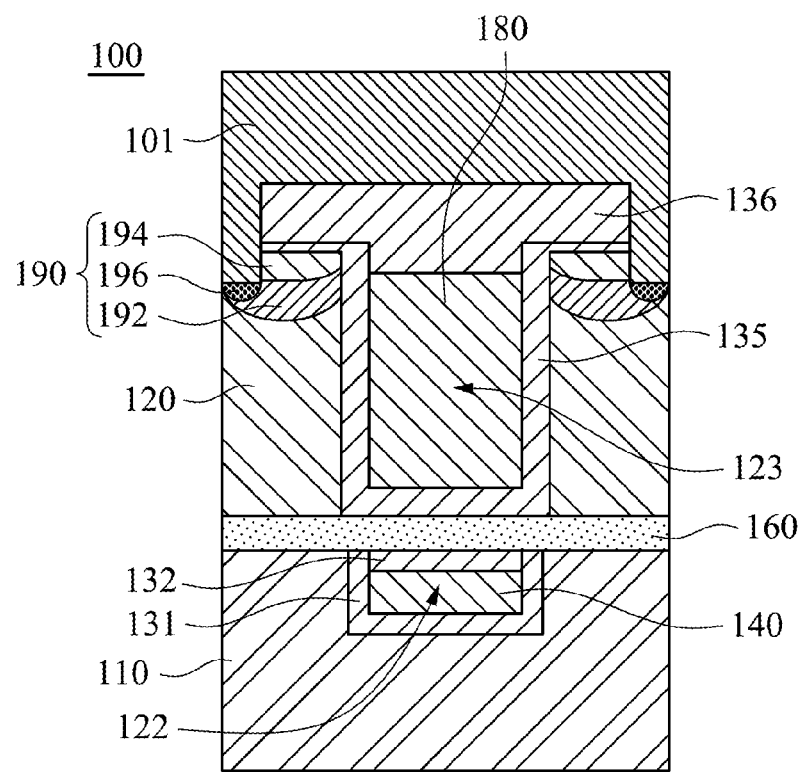

As shown in FIG. 5G, the hard mask layer 106 is removed, and the dielectric layer 135, the gate 180, the dielectric layer 136, the source 190, and the metal layer 101 are respectively formed.

In the embodiment, the dielectric layer 131, the shield layer 140, the dielectric layer 132, and the spacer layer 160 are respectively formed under the epitaxial layer 120, and the dielectric layer 135, the gate 180, the dielectric layer 136, the source 190, and the metal layer 101 are formed in or on the epitaxial layer 120. Therefore, the processes for manufacturing the semiconductor device 100 are divided into two parts, and the processes become easy to be performed.

In another aspect of the disclosure, a semiconductor device 100 is provided. As shown in FIG. 1J, the semiconductor device 100 includes a substrate 110, an epitaxial layer 120, a first dielectric layer (the first dielectric layer may be formed by the combination selected from the group consisting of the dielectric layers 131, 132, and 133), a shield layer 140, a second dielectric layer (the second dielectric layer may be formed by the combination selected from the group consisting of the dielectric layers 135 and 136), a gate 180, a spacer layer 160, and a source 190. The epitaxial layer 120 is disposed on the substrate 110. The first dielectric layer is disposed in the epitaxial layer 120. The shield layer 140 is disposed in the first dielectric layer. The second dielectric layer is disposed in the epitaxial layer 120 and above the first dielectric layer. The gate 180 is disposed in the second dielectric layer. The spacer layer 160 is disposed between the first dielectric layer and the second dielectric layer. The source 190 is disposed in the epitaxial layer 120 surrounding the second dielectric layer.

Specifically, the semiconductor device 100 further includes a barrier layer 150 disposed between the shield layer 140 and the spacer layer 160.

In another embodiment, as shown in FIG. 4H, the barrier layer 150 is disposed between the shield layer 140 and the epitaxial layer 120.

As shown in FIG. 3O, the width of the first dielectric layer, i.e., the dielectric layers 131 and 132 here, and the spacer layer 160 is less than the width of the second dielectric layer, i.e., the dielectric layers 135 and 136 here.

In another aspect of the disclosure, a semiconductor device 100 is provided. The semiconductor device 100 includes a substrate 110, a first dielectric layer (the first dielectric layer may be formed by the combination selected from the group consisting of the dielectric layers 131 and 132), a shield layer 140, a spacer layer 160, an epitaxial layer 120, a second dielectric layer (the second dielectric layer may be formed by the combination selected from the group consisting of the dielectric layers 135 and 136), a gate 180, and a source 190. The first dielectric layer is disposed in the substrate 110. The shield layer 140 is disposed in the first dielectric layer. The spacer layer 160 is disposed on the first dielectric layer and the substrate 110. The epitaxial layer 120 is disposed on the spacer layer 160. The second dielectric layer is disposed in the epitaxial layer 120 and above the first dielectric layer. The gate 180 is disposed in the second dielectric layer. The source 190 is disposed in the epitaxial layer 120 surrounding to the second dielectric layer.

All the features disclosed in this specification (including any accompanying claims, abstract, and drawings) may be replaced by alternative features serving the same, equivalent or similar purposes, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A method for manufacturing a semiconductor device, comprising:
   forming an epitaxial layer on a substrate;
   forming a trench in the epitaxial layer;
   forming a first dielectric layer and a shield layer in the trench, wherein the shield layer is embedded within the first dielectric layer;
   forming a spacer layer in the trench and on the first dielectric layer, wherein the spacer layer directly contacts the epitaxial layer, the spacer layer is made of PolySilicon, the dopant ion concentration of the spacer layer is greater than the dopant ion concentration of the epitaxial layer, and the first dielectric layer electrically isolates the spacer layer and the shield layer; and
   forming a second dielectric layer and a gate in the trench and on the spacer layer, and forming a source in the epitaxial layer surrounding the trench, wherein the spacer layer separates the first dielectric layer and the second dielectric layer, the gate is embedded within the second dielectric layer, and the source surrounds the gate.

2. The method of claim 1, wherein in the operation of forming the first dielectric layer and the shield layer, a barrier layer is formed between the shield layer and the spacer layer.

3. The method of claim 2, wherein the barrier layer is made of silicon nitride.

4. The method of claim 1, wherein in the operation of forming the first dielectric layer and the shield layer, a barrier layer is formed between the shield layer and the epitaxial layer.

5. The method of claim 1, wherein the trench has an upper part and a lower part, the diameter of the upper part is greater than the diameter of the lower part, the first dielectric layer, the shield layer, and the spacer layer are disposed in the lower part, the second dielectric layer and the gate are disposed in the upper part.

6. A semiconductor device, comprising:
a substrate;
an epitaxial layer disposed on the substrate;
a first dielectric layer disposed in the epitaxial layer;
a shield layer disposed in the first dielectric layer;
a second dielectric layer disposed in the epitaxial layer;
a gate disposed in the second dielectric layer;
a spacer layer disposed between the first dielectric layer and the second dielectric layer, wherein the spacer layer directly contacts the epitaxial layer and separates the first dielectric layer and the second dielectric layer, the spacer layer is made of PolySilicon, the dopant ion concentration of the spacer layer is greater than the dopant ion concentration of the epitaxial layer, and a part of the first dielectric layer is disposed between the spacer layer and the shield layer, such that the spacer layer is electrically isolated from the shield layer; and
a source disposed in the epitaxial layer surrounding the second dielectric layer.

7. The semiconductor device of claim 6, further comprising:
a barrier layer disposed between the shield layer and the spacer layer.

8. The semiconductor device of claim 7, wherein the barrier layer is made of silicon nitride.

9. The semiconductor device of claim 6, further comprising:
a barrier layer disposed between the shield layer and the epitaxial layer.

10. The semiconductor device of claim 6, wherein the width of the first dielectric layer and the spacer layer is less than the width of the second dielectric layer.

11. A semiconductor device, comprising:
a substrate;
a first dielectric layer disposed in the substrate;
a shield layer disposed in the first dielectric layer;
a spacer layer disposed on the first dielectric layer and the substrate, wherein the spacer layer is made of PolySilicon, and a part of the first dielectric layer is disposed between the spacer layer and the shield layer, such that the spacer layer is electrically isolated from the shield layer;
an epitaxial layer disposed on the spacer layer, wherein the spacer layer directly contacts the epitaxial layer, and the dopant ion concentration of the spacer layer is greater than the dopant ion concentration of the epitaxial layer;
a second dielectric layer disposed in the epitaxial layer, wherein the spacer layer separates the first dielectric layer and the second dielectric layer;
a gate disposed in the second dielectric layer; and
a source disposed in the epitaxial layer surrounding to the second dielectric layer.

* * * * *